United States Patent
Ding et al.

(10) Patent No.: US 9,443,801 B2
(45) Date of Patent: Sep. 13, 2016

(54) METHOD TO REDUCE METAL FUSE THICKNESS WITHOUT EXTRA MASK

(71) Applicant: STMicroelectronics, Inc., Coppell, TX (US)

(72) Inventors: Hai Ding, Phoenix, AZ (US); Fuchao Wang, Plano, TX (US); Zhiyong Xie, Pflugerville, TX (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 14/673,300

(22) Filed: Mar. 30, 2015

(65) Prior Publication Data

US 2015/0206839 A1    Jul. 23, 2015

Related U.S. Application Data (62) Division of application No. 12/265,595, filed on Nov. 5, 2008, now Pat. No. 9,059,174.

(51) Int. Cl.
*H01L 21/4763*    (2006.01)
*H01L 23/525*    (2006.01)
*H01L 21/768*    (2006.01)
*H01L 27/108*    (2006.01)

(52) U.S. Cl.
CPC ..... *H01L 23/5256* (2013.01); *H01L 21/76892* (2013.01); *H01L 23/5258* (2013.01); *H01L 27/10894* (2013.01); *H01L 2924/0002* (2013.01); *Y02E 60/12* (2013.01)

(58) Field of Classification Search
CPC .......... H01L 2924/0002; H01L 2924/00; H01L 21/76892; H01L 23/5256; H01L 23/5258; H01L 27/10894; Y02E 60/12
USPC ....... 438/128–129, 132, 215, 281, 333, 467, 438/601, 618; 257/209, 529, E21.592, 257/E23.149
See application file for complete search history.

(56) References Cited

U.S. PATENT DOCUMENTS

| | | | | |
|---|---|---|---|---|
| 5,244,836 A | * | 9/1993 | Lim | H01L 23/5256 148/DIG. 131 |
| 5,729,041 A | * | 3/1998 | Yoo | H01L 21/76888 257/529 |
| 6,255,671 B1 | * | 7/2001 | Bojarczuk, Jr. ... | H01L 21/76823 257/103 |
| 6,731,005 B2 | * | 5/2004 | Koyama | H01L 23/5258 257/209 |
| 6,822,310 B2 | | 11/2004 | Kono et al. | |
| 7,470,590 B2 | * | 12/2008 | Juengling | H01L 23/5256 257/E23.149 |
| 7,541,676 B2 | | 6/2009 | Lee et al. | |
| 7,666,734 B2 | | 2/2010 | Okada | |
| 7,671,361 B2 | | 3/2010 | Bang et al. | |
| 7,692,265 B2 | | 4/2010 | Takewaki et al. | |
| 7,799,617 B2 | | 9/2010 | Mun | |

(Continued)

*Primary Examiner* — Mohammed Shamsuzzaman
(74) *Attorney, Agent, or Firm* — Seed IP Law Group PLLC (57) ABSTRACT

Methods of fabricating a multi-layer semiconductor structure are provided. In one embodiment, a method includes depositing a first dielectric layer over a semiconductor structure, depositing a first metal layer over the first dielectric layer, patterning the first metal layer to form a plurality of first metal lines, and depositing a second dielectric layer over the first metal lines and the first dielectric layer. The method also includes removing a portion of the second dielectric layer over selected first metal lines to expose a respective top surface of each of the selected first metal lines. The method further includes reducing a thickness of the selected first metal lines to be less than a thickness of the unselected first metal lines. A multi-layer semiconductor structure is also provided.

14 Claims, 4 Drawing Sheets

(56) References Cited

U.S. PATENT DOCUMENTS

| | | |
|---|---|---|
| 2001/0034084 A1 | 10/2001 | Bouldin et al. |
| 2003/0030124 A1 | 2/2003 | Nagatani |
| 2003/0129850 A1* | 7/2003 | Olgado .................... C23F 1/18 438/745 |
| 2005/0040491 A1* | 2/2005 | Lee ..................... H01L 23/5258 257/529 |
| 2005/0087837 A1* | 4/2005 | Omura ................ H01L 23/5258 257/529 |
| 2005/0164430 A1 | 7/2005 | Okada |
| 2007/0176258 A1 | 8/2007 | Fujiki et al. |
| 2008/0048309 A1* | 2/2008 | Corisis .................... H01L 23/13 257/686 |
| 2008/0217735 A1 | 9/2008 | Chen et al. |
| 2008/0303406 A1* | 12/2008 | Yanase ................... H01J 9/022 313/495 |
| 2009/0001508 A1 | 1/2009 | Fujiki et al. |
| 2009/0166803 A1 | 7/2009 | Kim |
| 2010/0109122 A1 | 5/2010 | Ding et al. |

* cited by examiner

METHOD TO REDUCE METAL FUSE THICKNESS WITHOUT EXTRA MASK

BACKGROUND

1. Technical Field

This invention relates to integrated circuit (IC) fabrication and, in particular, metal fuses having a low height in the end die. One technique to achieve this is to reduce the thickness of the metal fuse during die fabrication.

2. Description of the Related Art

Laser trimming is a technique employed during die fabrication to achieve specific tasks. For example, laser trimming may be used to result in accurate resistors, to re-route circuits, to repair defective dies, and to optimize test distribution of electrical wafer sorting. After electrical wafer testing and sorting, laser trimming is typically used to burn metal lines of a die that are fuse lines to repair defective circuits or dies.

Fuse lines are used to connect redundant circuits or disconnect defective circuit components. The material of fuse lines in ICs may be either poly silicon or metal. Poly silicon fuse lines are usually used in layers located far deep in the finished wafer. This renders fuse window processes more difficult. Thus, for multi-metal-layer ICs, metal fuse lines are preferred. Typically, metal lines formed from the second to last metal layer are chosen to be used as the fuse lines. In order to save production cost and to achieve process simplicity, fuse lines and signal and interconnect lines are often formed from the same metal layer. The metal layer thickness and the minimum critical dimension are typically defined by the fabrication technology. For example, in certain technologies that process silicon wafers with bipolar-CMOS, the metal layer from which metal fuse lines are formed is the metal 2 layer with a thickness that varies from 0.5 µm to 1.1 µm.

It is well known that narrow width and low aspect ratio of fuse lines are desired from the perspective of laser trimming efficiency. A metal fuse line for laser trimming is preferred to have a thickness of no more than 0.5 µm so the fuse can more easily be blown. On the other hand, signal lines and interconnect lines have a lower resistance if they are made thicker and wider. A signal line with a thickness over 1 µm is preferred. Metal fuse lines are formed from the same metal layer as interconnect lines, and they may have a thickness of greater than 0.5 µm. Consequently, higher laser pulse energy is required to burn and remove thicker metal fuse lines. Using higher energy, however, raises the risk of causing damage to lower layer/layers, the substrate, and/or to neighboring fuse or circuit lines. Other undesirable problems caused by the use of higher energy in laser trimming include: fluctuation of trimming efficiency, metal residual, and inter-layer dielectric cracking.

There is thus a tradeoff of having lower resistance interconnect lines or easy to blow fuse lines if both are made in the same layer.

BRIEF SUMMARY

In one aspect, a method includes depositing a first dielectric layer over a semiconductor structure, depositing a first metal layer over the first dielectric layer, patterning the first metal layer to form a plurality of first metal lines, and depositing a second dielectric layer over the first metal lines and the first dielectric layer. Next, a portion of the second dielectric layer is removed over selected first metal lines to expose a respective top surface of a portion of each of the selected first metal lines where a fuse will be formed. The thickness of this fuse portion of the selected first metal lines is then reduced to be less than a thickness of the unselected first metal lines in the same layer. One technique by which the first metal lines can be reduced is wet etching in a timed etch that removes a known amount of metal to reduce the thickness of the metal lines where the fuse is present.

In one aspect, a method includes forming a plurality of first metal lines in a first metal layer over a semiconductor structure. A plurality of second metal lines in a second metal layer above the first metal layer is formed. There is a region or portion of the first metal lines which is not overlaid by the second metal lines. Some portions of the first metal lines are exposed by some selected technique, such as by etching. A thickness of the selected portions of the first metal lines is then reduced to be less than a thickness of the unselected first metal lines.

In one aspect, a multi-layer semiconductor structure includes a semiconductor structure, a first dielectric layer over the semiconductor structure, a plurality of metal interconnect lines and a plurality of fuse portions formed from the same metal layer over the first dielectric layer, and a second dielectric layer over the metal lines. The fuse portions have a thickness less than a thickness of the metal interconnect lines.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

DETAILED DESCRIPTION

FIGS. 1A-1G illustrate process steps for forming a multi-layer semiconductor structure.

Figure 1A:
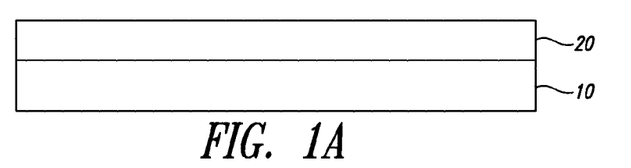
FIGS. 1A-1G illustrate process steps of a multi-layer semiconductor structure.

In FIG. 1A, a multi-layer semiconductor structure is fabricated by depositing a first dielectric layer 20 over a semiconductor structure 10. In one embodiment, the semiconductor structure 10 is a substrate, for example, a wafer made of silicon crystal having doped regions therein. In another embodiment, the semiconductor structure 10 may comprise a stack of one or more dielectric and/or metal layers deposited over a substrate. Alternatively, the semiconductor structure 10 may comprise one or more dielectric, poly silicon, and/or metal layers deposited over a substrate to form a plurality of transistors, resistors or circuits. In one embodiment, the one or more metal layers in the semiconductor structure 10 may include metal lines used as interconnect lines of the die or integrated circuit. The dielectric layer 20 may be a single layer or a stack of layers which are all electrical insulators.

Figure 1B:
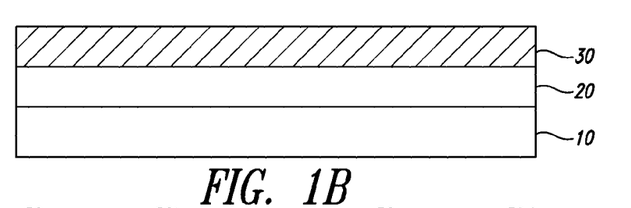

As shown in FIG. 1B, a first metal layer 30 is deposited over the first dielectric layer 20. Chemical mechanical polishing (CMP) may be carried out before or after the deposition of any layer of material to planarize the layer just deposited before another layer of material is deposited over the semiconductor structure. In the interest of brevity, the detailed process steps involving CMP will neither be described nor illustrated since these are well known in the art.

Figure 1C:
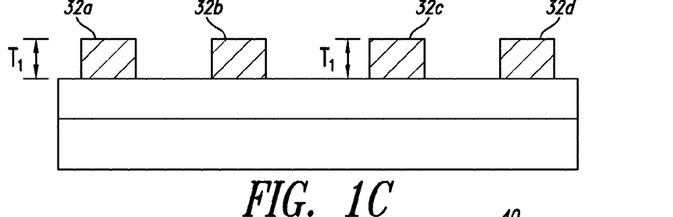

As shown in FIG. 1C, the first metal layer 30 is patterned to form a plurality of first metal lines 32a-32d. Typically, this will involve photolithography (not shown), which includes the steps of deposition of photoresist, exposing the photoresist and the semiconductor structure to ultraviolet light or x-ray, and etching the semiconductor structure to remove a target amount of the upper portion of the semiconductor structure followed by resist removal. In the interest of brevity, the details of photolithography are not described since they are well known in the art.

In various embodiments, there may be dozens or hundreds of first metal lines, but only four metal lines (the first metal lines 32a-32d) are shown in FIGS. 1C-1G for simplicity and to avoid unnecessarily obscuring the figures. Some of the first metal lines 32a-32d are selected to be fuse lines, according to the design of the integrated circuit, while the remainder of the first metal lines 32a-32d are to be used as interconnect lines for power lines or signals. In one embodiment, for example, the first metal lines 32b and 32c are selected to be fuse lines of the integrated circuit, and the first metal lines 32a and 32d are to be used as interconnect lines of the integrated circuit. Given that all of the first metal lines 32a-32d are formed from the same metal layer at the same time in the same process steps, the thickness $T_1$ of each of the first metal lines 32a-32d should be approximately the same as one another.

Figure 1D:
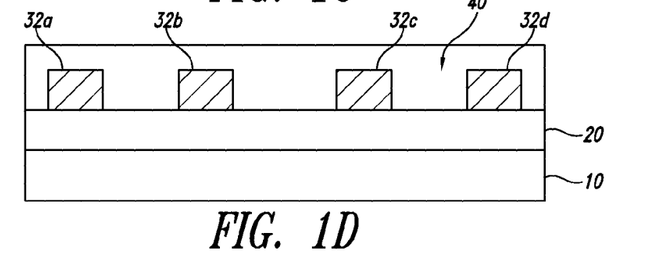

As shown in FIG. 1D, a passivation layer 40, is deposited over the first metal lines 32a-32d as well as the first dielectric layer 20. The passivation layer 40 may have a thickness of 10 to 30 kA (1 to 3 μm). A layer of photoresist (not shown) may be deposited over the passivation layer 40 for photolithography, including etching, to be carried out in subsequent process steps depicted in FIGS. 1E-1G.

Figure 1E:
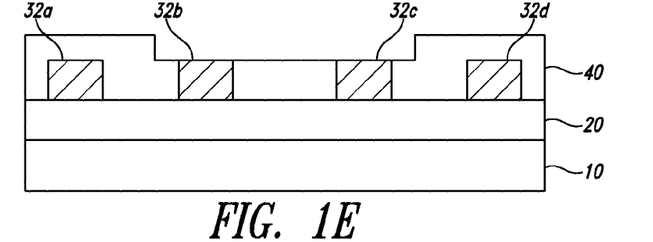

As shown in FIG. 1E, a fuse window is opened by using photoresist patterning and etching of a portion of the passivation layer 40. More specifically, the portion of the passivation layer 40 that is directly above a region of the first metal lines 32b and 32c, which are the ones of the first metal lines 32a-32d selected to be fuse lines, is etched away. The etching process will continue until the top surface of the metal fuse lines, the first metal lines 32b and 32c, is exposed. This etch is necessary because the thickness of any insulation layer over the fuse cannot be as thick as the passivation layer 40. The insulation layer should be thin enough for laser to pass through to burn the fuse properly. The end of the etching can be determined by sensing for metal in the etch chemistry, indicating that the metal layer has been exposed, or it can be time etched. In one embodiment, dry oxide etching may be the etching method of choice in order to avoid significant undercutting of the photoresist pattern (not shown).

Figure 1F:
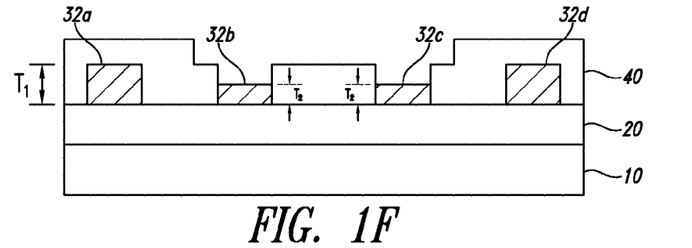

In the next step, the upper portion of each of the exposed first metal lines 32b and 32c is etched away, as shown in FIG. 1F. The thickness of the first metal lines 32b and 32c is reduced to be less than the thickness of the unselected first metal lines 32a and 32d in those regions where they will act as fuses. In one embodiment, wet metal etching is the etching method of choice due to better selectivity provided by wet metal etching relative to a dry etching process. Some wet etch chemistries provide better selectivity relative to the surrounding dielectric than reactive ion etching or other dry etches. An isotropic etch may be used since the wet etch will have good selectivity relative to the sidewalls of the dielectric and the result will be an isotropic etch of the metal. Alternatively, a dry etch or anisotropic etch may be used. It is preferred if etching is carried out, whether wet or dry, that it has good selectivity relative to other structures that are exposed to the etch, such as the passivation layer 40.

The etch will be selected based on the type of metal and the dielectric material. In one embodiment, the metal 30 is aluminum or an aluminum alloy containing small amounts of copper and/or silicon. In other embodiments, the metal is a copper or copper alloy. The dielectric may be either a silicon dioxide, either undoped or a borophosphosilicate glass (BPSG) or phosphosilicate glass (PSG), or an oxide, nitride stack, or some other well-known dielectric or combination of dielectric layers or sublayers.

Etch chemistries that selectively etch aluminum or copper relative to an oxide or a nitride are well known in the art and any of the many available etches can be used, whether wet or dry.

The fuse region will therefore have a thickness $T_2$, which is less than $T_1$. The target thickness is achieved by timing the etch. The precise thickness is not critical since this portion will be used as a fuse. Making it thinner in this region will make it easier to blow the places in which an open circuit is desired, yet it should not be made so thin as to become a poor conductor or break in the event it is desired to maintain it as a conductor and not blow the fuse.

A final thickness $T_2$ is therefore selected that will provide sufficient conductivity where the wire is to remain and yet be easy to destroy in a laser burning procedure. The preferred thickness will vary depending on the type of metal used on the circuit connections that lines 32b and 32c make when they are left as conductors. For aluminum, a preferred thickness is in the range of 0.3 to 0.6 μm, with 0.5 μm being an acceptable target thickness $T_2$. If the lines 32b and 32c are quite wide, then a thinner height, less than 0.3 μm may provide acceptable conductivity. For copper, which is much more conductive than aluminum, the target thickness may be optimized in different process approaches.

Those regions of lines 32a and 32d which are not exposed by the etch of dielectric in step 1E remain the original thickness $T_1$. This area is out of the plane of FIGS. 1E and 1F, so it is not shown, however, the opening in the passivation layer 40 will have a length and width as viewed from the top that exposes those regions which will act as fuses and leaves those regions of lines 32b and 32c which will act as conductors to and from the fuses at their original height.

Figure 1G:
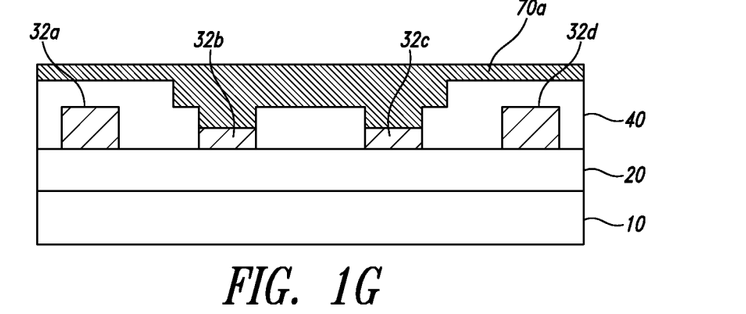

In FIG. 1G, an insulating layer 70a may be deposited over the fuse and other semiconductor structure at least for the purpose of insulating the fuse lines from the elements of the ambience. In one embodiment, the material of the insulating layer 70a may comprise undoped silicate glass (USG). The insulating layer 70a may be a thicker, planarized layer, as shown in FIG. 1G, or it may be a conformal layer 70b, as shown and described with respect to FIG. 2J. One or more passivation layers (not shown) may be position over the insulating layer 70a.

It is expected that the layers 70a and 70b will be made of a material that will permit laser light to pass therethrough for blowing the fuse. The total thickness and composition of each of the layers 70a and 70b depend on the laser wavelength and power. Many such covering layers for fuses, whether conformal or planar or combinations thereof, are well-known in the art and need not be disclosed since those of skill in the art know of many such layers that could be substituted in place of each other.

With the fabrication process as illustrated in FIGS. 1A-1G, the metal fuse lines are etched, such as by wet metal etching, without requiring any additional masking steps or those that involve photolithography. For example, no extra mask is needed and no new photoresist needs to be formed before the wet metal etching step takes place between the dielectric etch of FIG. 1E and the metal etch of FIG. 1F. The photoresist in place from the dry oxide etching step can also be used during the wet metal etching process. Or, once the passivation layer 40 is etched, the photoresist can be stripped and the passivation layer 40 acts itself as an etching mask to prevent the unexposed metal layers and regions from being etched while permitting etching of exposed metal layers. It is usually common to strip the photoresist when it is not needed during a subsequent etch to reduce the contamination of the semiconductor with the photoresist decaying as the etch takes place.

Accordingly, the fabrication process just described selectively reduces the thickness of metal fuse lines to achieve a target thickness $T_2$ while keeping the thickness of the interconnect lines in other parts of the die unchanged from their original thickness $T_1$. Furthermore, with the thickness of the fuse lines reduced, subsequent laser trimming to burn the fuse lines will yield better efficiency, less metal residue, and less inter-layer dielectric cracking, and provide for less time in burning those fuses which need to be burned.

FIGS. 2A-2J illustrate process steps of a multi-layer semiconductor structure in which there is a metal layer above the fuse layer.

Figure 2A:
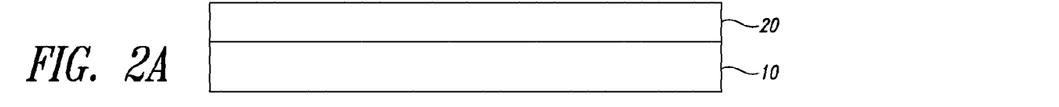
FIGS. 2A-2J illustrate process steps of a multi-layer semiconductor structure.

In FIG. 2A, a multi-layer semiconductor structure is fabricated by first depositing a first layer of dielectric material, or the first dielectric layer 20, over a semiconductor structure 10. In one embodiment, the semiconductor structure 10 may be a substrate, for example, a wafer made of silicon crystal. In another embodiment, the semiconductor structure 10 may comprise one or more dielectric and/or metal layers deposited over a substrate. Alternatively, the semiconductor structure 10 may comprise one or more dielectric, poly silicon, and/or metal layers deposited over a substrate. In one embodiment, the one or more metal layers in the semiconductor structure 10 may include metal lines used as interconnect lines of the integrated circuit.

As in the embodiment of FIGS. 1A-1G, the semiconductor 10 may have one or more metal, poly, or other conductive lines alternating with dielectric lines in the layers below the fuse layer 32.

Figure 2B:
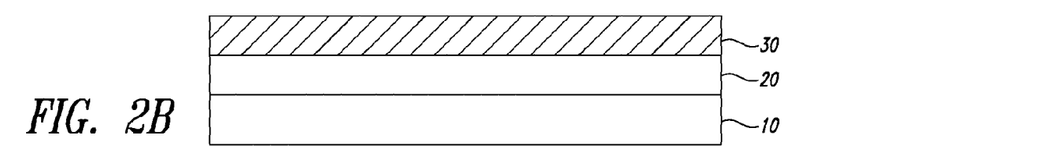

In FIG. 2B, a first metal layer 30, is deposited over the first dielectric layer 20.

Figure 2C:
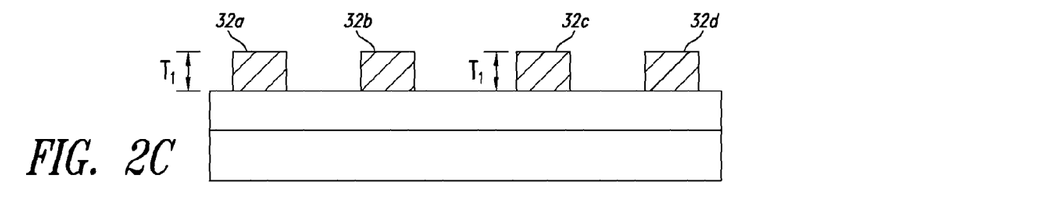

In FIG. 2C, the first metal layer 30 is patterned to form a plurality of first metal lines 32a-32d. The lines 32a-32c are formed by the same techniques as the same lines 32a-32d of FIGS. 1B-1D, so further details are not provided here.

In various embodiments, there may be more than the number of metal lines shown in the figures but only four metal lines (the first metal lines 32a-32d) are shown in FIGS. 2C-2J for simplicity and to avoid unnecessarily obscuring the figures. Some of the first metal lines 32a-32d are selected to be fuse lines, according to the design of the integrated circuit, while the remainder of the first metal lines 32a-32d are to be used as interconnect lines. In one embodiment, for example, the first metal lines 32b and 32c are selected to be fuse lines of the integrated circuit, and the first metal lines 32a and 32d are to be used as interconnect lines of the integrated circuit. Given that all of the first metal lines 32a-32d are formed from the same metal layer, the first metal layer 30, the thickness of each of the first metal lines 32a-32d should be approximately the same as one another.

Figure 2D:
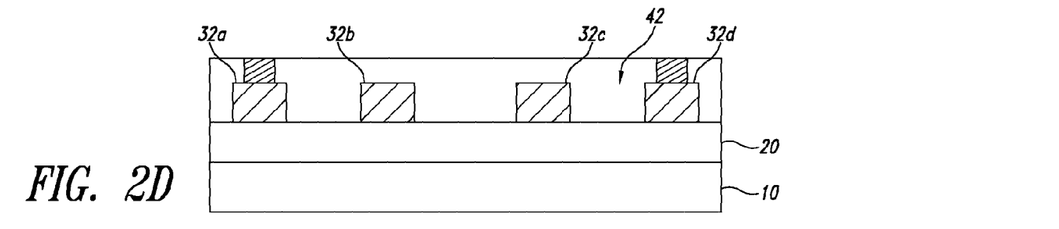
Figure 2E:
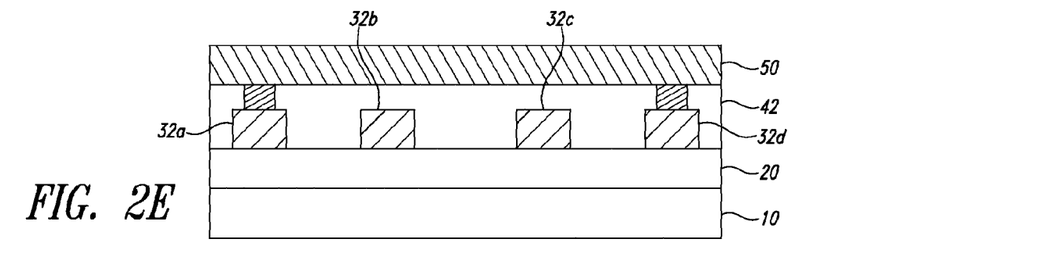

In FIG. 2D, a second layer of dielectric material, or the second dielectric layer 40, is deposited over the first metal lines 32a-32d as well as the first dielectric layer 20. A second layer of metallic material, or the second metal layer 50, is deposited over the second dielectric layer 42.

Figure 2F:
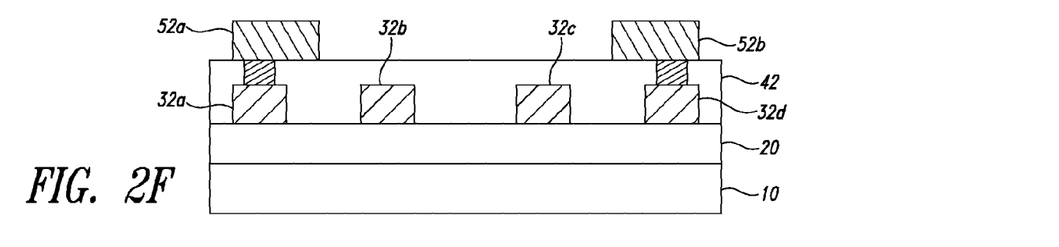

In FIG. 2F, the second metal layer 50 is patterned to form a plurality of second metal lines 52a-52b. In various embodiments, there may be more than the number of second metal lines shown in the figures but only two metal lines (the second metal lines 52a and 52b) are shown in FIGS. 2F-2J for simplicity and to avoid unnecessarily obscuring the figures. The second metal lines 52a and 52b are not directly above the fuse lines, the first metal lines 32b and 32c, so that a fuse window may later be formed to allow the thickness of the fuse lines to be reduced by etching and to allow the fuse lines to be burned by laser trimming.

Figure 2G:
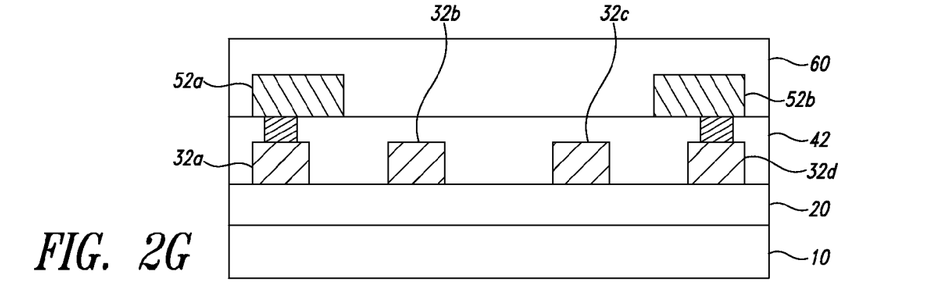

In FIG. 2G, a passivation layer 60 is deposited over the second metal lines 52a-52b as well as the second dielectric layer 42. A layer of photoresist (not shown) may be deposited over the passivation layer 60 for photolithography, including etching, to be carried out in subsequent process steps depicted in FIGS. 2H-2J.

Figure 2H:
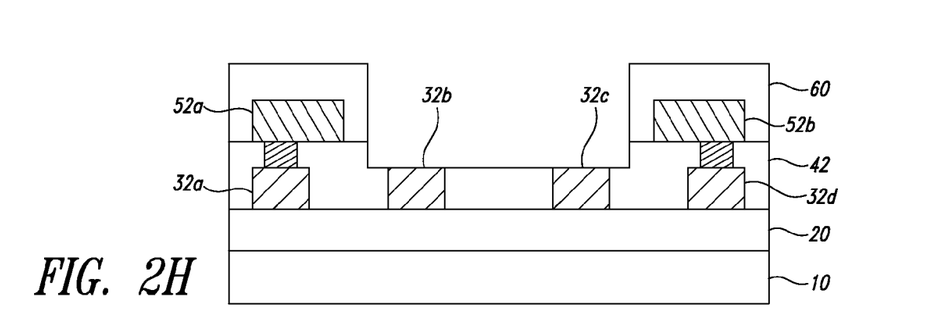

In FIG. 2H, a fuse window is opened by etching away a portion of the passivation layer 60 and a portion of the second dielectric layer 42. More specifically, the portion of the passivation layer 60 and the portion of the second dielectric layer 42 that are directly above the fuse lines, first metal lines 32b and 32c, are etched away. The etching process may continue until the top surface of the metal fuse lines, the first metal lines 32b and 32c, is exposed. In one embodiment, dry oxide etching may be the etching method of choice in order to avoid significant undercutting of the photoresist pattern (not shown).

Figure 2I:
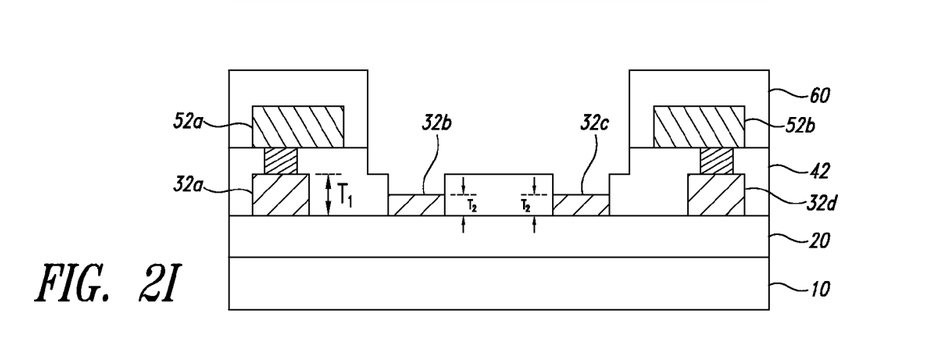
Figure 2J:
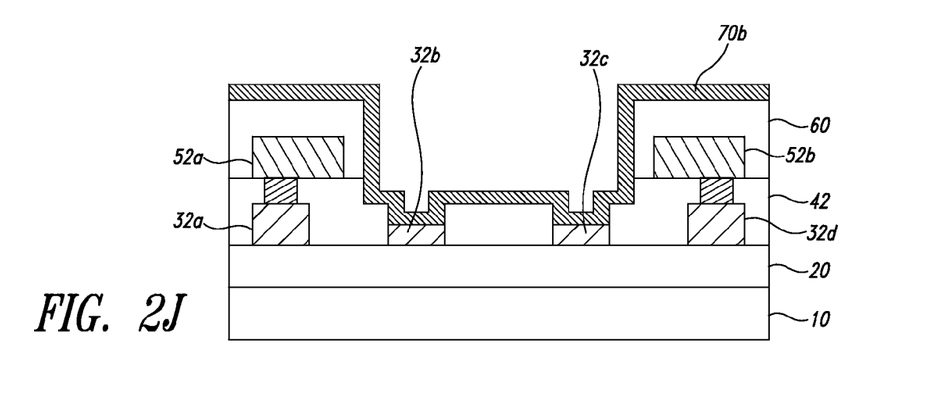

In FIG. 2I, the upper portion of each of the exposed fuse lines is etched away. Thus, the thickness ($T_2$) of the fuse lines, the first metal lines 32b and 32c, is reduced to be less than the thickness ($T_1$) of the interconnect lines, the first metal lines 32a and 32d. In one embodiment, wet metal etching may be the etching method of choice due to better selectivity provided by wet metal etching relative to a dry etching process. The same steps, techniques and etch chemistries used to create the reduced thickness fuses in FIGS. 1A-1G may be used for this embodiment and thus are not repeated here.

In FIG. 2J, an insulating layer 70b may be deposited over the fuse and other semiconductor structure at least for the purpose of insulating the fuse lines from the elements of the ambience. In one embodiment, the material of the insulating layer 70 may comprise a spun on glass, a combination of layers including a USG layer, a BPSG layer, and an undoped oxide layer over the BPSG layer. This layer 70b may be a conformal layer, as shown in FIG. 2J, or a planar layer comprised of one thick, planarizing layer, or a plurality of sublayers, with planar top surface, as shown in FIG. 1G. The total thickness of each of the layers 70a and 70b is selected so that the laser beam can pass through to burn the fuse properly.

With the fabrication process as illustrated in FIGS. 2A-2J, the metal fuse lines are etched, such as by wet metal etching, without requiring any additional steps usually involved in photolithography. For example, no extra mask is needed and no new photoresist needs to be formed before the wet metal etching step takes place because the photoresist in place from the dry oxide etching step can also be used during the wet metal etching process. Accordingly, the fabrication process just described selectively reduces the thickness of metal fuse lines to achieve a target thickness while keeping the thickness of the interconnect lines in other parts of the die unchanged. Furthermore, with the thickness of the fuse lines reduced, subsequent laser trimming to burn the fuse lines should yield better efficiency, less metal residue, and less inter-layer dielectric cracking.

As a further alternative, if it is desired to provide fuses in different step than the step in which interconnect lines are formed, a technique is to form the fuse lines in a dedicated metal layer having the desired thickness, $T_2$. The entire metal layer out of which the fuses will be formed is made this thickness, $T_2$, and then it is patterned and etched to create the fuse lines. These fuse lines can then be masked and a separate metal layer formed at the same level, on top of the same insulator, to provide the interconnect layer, or be formed on a different insulator to make an interconnect layer.

In the above description, certain specific details are set forth in order to provide a thorough understanding of various disclosed embodiments. Embodiments of the invention may be practiced without one or more of these specific details, or with other methods, components, materials, etc. Some well-known structures associated with integrated circuits have not been shown or described in detail since they are within the knowledge of one of ordinary skill in the art.

Unless the context requires otherwise, throughout the specification and claims which follow, the word "comprise" and variations thereof, such as "comprises" and "comprising," are to be construed in an open, inclusive sense, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The above description of illustrated embodiments, including what is described in the Abstract, is not intended to be exhaustive or to limit the various embodiments to the precise forms disclosed. Although specific embodiments of and examples are described herein for illustrative purposes, various equivalent modifications can be made without departing from the spirit and scope of the disclosure, as will be recognized by those skilled in the relevant art.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A method, comprising:
    depositing a first dielectric layer over a semiconductor structure;
    depositing a first metal layer over the first dielectric layer;
    patterning the first metal layer to form a plurality of first metal lines;
    depositing a second dielectric layer over upper surfaces and along side surfaces of the first metal lines and over the first dielectric layer;
    removing a portion of the second dielectric layer over selected first metal lines to expose a respective top surface of each of the selected first metal lines;
    reducing a thickness of the selected first metal lines to be less than a thickness of the unselected first metal lines; and
    depositing a conformal insulating layer over exposed surfaces of the second dielectric layer, and the exposed top surfaces of the selected first metal lines,
    wherein the conformal insulating layer over each of the selected first metal lines has a first portion and a second portion, the first portion having a first thickness and the second portion having a second thickness, the second thickness being the same as the first thickness and forming a step feature over the selected first metal lines.

2. The method of claim 1 wherein removing a portion of the second dielectric layer over the selected first metal lines comprises dry oxide etching a portion of the second dielectric layer over the selected first metal lines.

3. The method of claim 1 wherein reducing the thickness of the selected first metal lines comprises wet metal etching the selected first metal lines to remove a selected amount of metal to achieve a target thickness.

4. The method of claim 1, further comprising:
    depositing a second metal layer over the second dielectric layer;
    patterning the second metal layer to form a plurality of second metal lines; and
    depositing a passivation layer over the second metal lines and the second dielectric layer.

5. The method of claim 4 wherein removing a portion of the second dielectric layer over the selected first metal lines comprises removing a portion of the passivation layer and a portion of the second dielectric layer over the selected first metal lines.

6. A method, comprising:
    forming a plurality of first metal lines in a first metal layer over a semiconductor structure, the plurality of first metal lines including a first set of first metal lines and a second set of first metal lines;
    forming a first dielectric layer over the plurality of first metal lines having an initial thickness;
    forming a plurality of second metal lines in a second metal layer that is above the second set of first metal lines, while not being above the first set of first metal lines;
    removing a portion of the first dielectric layer and exposing a surface of the first dielectric layer and surfaces of the first set of first metal lines, wherein the first dielectric at the exposed surface has a reduced thickness that is less than the initial thickness;
    reducing a thickness of the first set of first metal lines to be less than a thickness of the second set of first metal lines and the reduced thickness of the first dielectric layer; and
    depositing a conformal layer over the exposed surface of the first dielectric layer and the first set of metal lines, wherein the conformal layer that is over each of the metal lines of the first set has a first portion having a first thickness and a second portion over the exposed surface of the first dielectric layer having a second thickness, the first thickness of the first portion and the second thickness of the second portion being the same and forming a step feature over the first set of first metal lines.

7. The method of claim 6 wherein reducing the thickness of the first set of first metal lines comprises wet metal etching the first set of first metal lines to the reduced thickness that is less than the thickness of the second set of first metal lines.

8. The method of claim 6, further comprising:
depositing a second dielectric layer over the first dielectric layer, and
wherein removing a portion of the first dielectric layer and exposing a surface of the first dielectric layer and surfaces of the first set of first metal lines comprises dry oxide etching a portion of the second dielectric layer and the first dielectric layer.

9. The method of claim 6, further comprising:
depositing a second dielectric layer over the semiconductor structure before forming the first metal lines.

10. The method of claim 9, further comprising:
wherein removing a portion of the first dielectric layer comprises removing a portion of the first dielectric layer and a portion of a passivation layer.

11. The method of claim 10 wherein removing a portion of the passivation layer and a portion of the first dielectric layer comprises dry oxide etching a portion of the passivation layer and a portion of the first dielectric layer to expose a top surface of the first set of the plurality of first metal lines.

12. The method of claim 11 wherein reducing the thickness of the first set of first metal lines comprises wet metal etching the first set of first metal lines to a reduced thickness less than a thickness of the second set of first metal lines.

13. A method, comprising:
forming a plurality of first metal lines in a first metal layer over a semiconductor structure, the plurality of first metal lines including a first set of first metal lines and a second set of first metal lines;
forming a first dielectric layer over and along side surfaces of first metal lines having an initial thickness;
removing surfaces of the first set of first metal lines and a portion of the first dielectric layer and exposing a surface of the first dielectric layer having a reduced thickness that is less than the initial thickness, the surface of the first dielectric layer and the surfaces of the first set of first metal lines being coplanar;
reducing a thickness of the first set of metal lines to be less than a thickness of the second set of first metal lines and the reduced thickness of the first dielectric layer; and
depositing a conformal layer over exposed surfaces of the first dielectric layer and the first set of metal lines, wherein the conformal layer has first portions and second portions over the first set of metal lines and exposed surface of the first dielectric layer, the first portions having first thicknesses, the second portions having second thicknesses, the second thicknesses being the same as the first thicknesses and forming a step feature over the first set of first metal lines.

14. The method of claim 13 wherein reducing the thickness of the first set of metal lines comprises reducing the thickness of the first set of metal lines to have a same thickness as each other.

* * * * *